United States Patent
Hurtado

(10) Patent No.: US 7,241,642 B2
(45) Date of Patent: Jul. 10, 2007

(54) MOUNTING AND DICING PROCESS FOR WAFERS

(75) Inventor: Alejandro Hurtado, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/769,534

(22) Filed: Jan. 30, 2004

(65) Prior Publication Data

US 2005/0170559 A1   Aug. 4, 2005

(51) Int. Cl.
*H01L 21/00*   (2006.01)
(52) U.S. Cl. ..................................... 438/113
(58) Field of Classification Search ............. 257/620, 257/730–754, 625, 626; 438/113
See application file for complete search history.

(56) References Cited

U.S. PATENT DOCUMENTS

| | | | |
|---|---|---|---|
| 6,399,464 B1 * | 6/2002 | Muntifering et al. | 438/465 |
| 6,420,776 B1 * | 7/2002 | Glenn et al. | 257/620 |
| 6,511,863 B2 * | 1/2003 | Farnworth et al. | 438/106 |
| 6,661,080 B1 * | 12/2003 | Glenn et al. | 257/620 |
| 6,794,273 B2 * | 9/2004 | Saito et al. | 438/462 |
| 2002/0001688 A1 * | 1/2002 | Ueda et al. | 428/35.7 |
| 2002/0161100 A1 * | 10/2002 | Kojima et al. | 524/492 |
| 2003/0180987 A1 * | 9/2003 | Milla et al. | 438/109 |
| 2004/0266139 A1 * | 12/2004 | Shibata | 438/465 |
| 2005/0035462 A1 * | 2/2005 | Johnson | 257/777 |

* cited by examiner

*Primary Examiner*—Nathan W. Ha
(74) *Attorney, Agent, or Firm*—Blakely, Sokoloff, Taylor & Zafman LLP

(57) ABSTRACT

Embodiments of the invention provide methods for mounting and dicing a double bumped wafer. For one embodiment, the thickness of the adhesive layer of a dicing tape is greater than the height of the bumps to which it is applied, such that the adhesive layer conforms to the bumps and distributes the pressure of a mounting roller more evenly. For one embodiment, the dicing tape has an adhesive layer approximately twice the thickness of the wafer bump to which it is applied. For one embodiment, a radiation sensitive adhesive is used that has a pre-radiation adhesive strength of approximately 200 grams/25 mm$^2$ and a post-radiation adhesive strength of approximately 2 grams/25 mm$^2$. For one embodiment, a dual blade dicing process is employed that cuts into only a portion of the adhesive layer of the dicing tape in order to reduce adhesive blade loading.

9 Claims, 5 Drawing Sheets

MOUNTING AND DICING PROCESS FOR WAFERS

FIELD

Embodiments of the invention relate generally to the field of semiconductor device manufacturing and, more particularly, to methods and apparatuses for mounting and dicing wafers.

BACKGROUND

A portion of the semiconductor device manufacturing process involves the processes of mounting and dicing a semiconductor wafer into singulated components. Typically, the wafer includes a plurality of semiconductor dice or semiconductor packages ("dice"). One technique for dicing a wafer is saw cutting. With saw cutting, the wafer is mounted to a support member, and a diamond tipped saw rotating at high speed saws the wafer along pre-formed lines known as streets.

A typical support member for dicing a wafer is known as a film frame. The film frame includes a metal frame, and an adhesive dicing tape stretched across the metal frame. The dicing tape is typically a polymer film having an adhesive layer of approximately 10 microns on at least one side. The dicing tape is formulated to provide a high adhesion with the wafer in order to prevent the wafer, and the singulated components, from moving during the dicing process.

The high adhesion of the dicing tape is also advantageous for transporting the singulated components on the film frame for further processing, such as packaging. However, the high adhesion of the dicing tape is a disadvantage when the singulated components must be removed from the tape. For example, mechanisms, such as pushers and vacuum picks, are utilized to either push or pull the singulated components from the dicing tape. These mechanisms are hampered by the high adhesion of the dicing tape, which must be overcome to separate the singulated components from the tape.

This problem can be addressed through the use of a dicing tape having an adhesive that is sensitive to a radiation, such as ultraviolet radiation. With a radiation sensitive dicing tape, exposure of the backside of the tape to the radiation reduces the adhesion of the tape, allowing the singulated components to be more easily separated from the tape. Typically, the entire backside of the dicing tape is exposed to the radiation, and adhesion of the tape can be significantly reduced.

The dicing tape is applied to the wafer and pressed against the wafer by a roller that applies pressure to the dicing tape and the wafer. Typically, the dicing tape will be rolled onto the backside of the wafer. This is because the frontside of the wafer may have bump electrodes (bumps), which would provide less contact area for the dicing tape. Moreover, the bump electrodes on the frontside of the wafer could be damaged by the pressure from the roller.

Recently, to facilitate wafer stacking schemes, wafers having bumps on both sides have been developed. Such wafers present problems in regard to typical dicing tape application procedures. For example, the wafers are typically very thin (approximately 150 microns). This is because the bumps on each side are typically connected through vias in the wafer. The vias may be formed by chemical drilling. The wafers may be thinned to better effect such chemical drilling and to maintain a small stack height. Such thin and fragile wafers can be easily damaged during the mounting and dicing process and the resultant thin die, when singulated, may not adhere well to the dicing tape.

Additionally, the bumps on at least one side of the wafer may be made of lead, a lead/tin alloy, or some other low melting point metal, to allow bonding to another wafer through a bump reflow process. Such metals are relatively soft compared to copper, which is typically used for bumps on a one-sided bumped wafer. Such soft metal bumps are more susceptible to deformation during the mounting and dicing process.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

One embodiment of the invention provides a method for mounting and dicing a wafer that employs a high-tack radiation sensitive dicing tape having an adhesive layer that is thick enough to conform around the bumps so as protect the bumps from deformation during application of the dicing tape.

Figure 1:
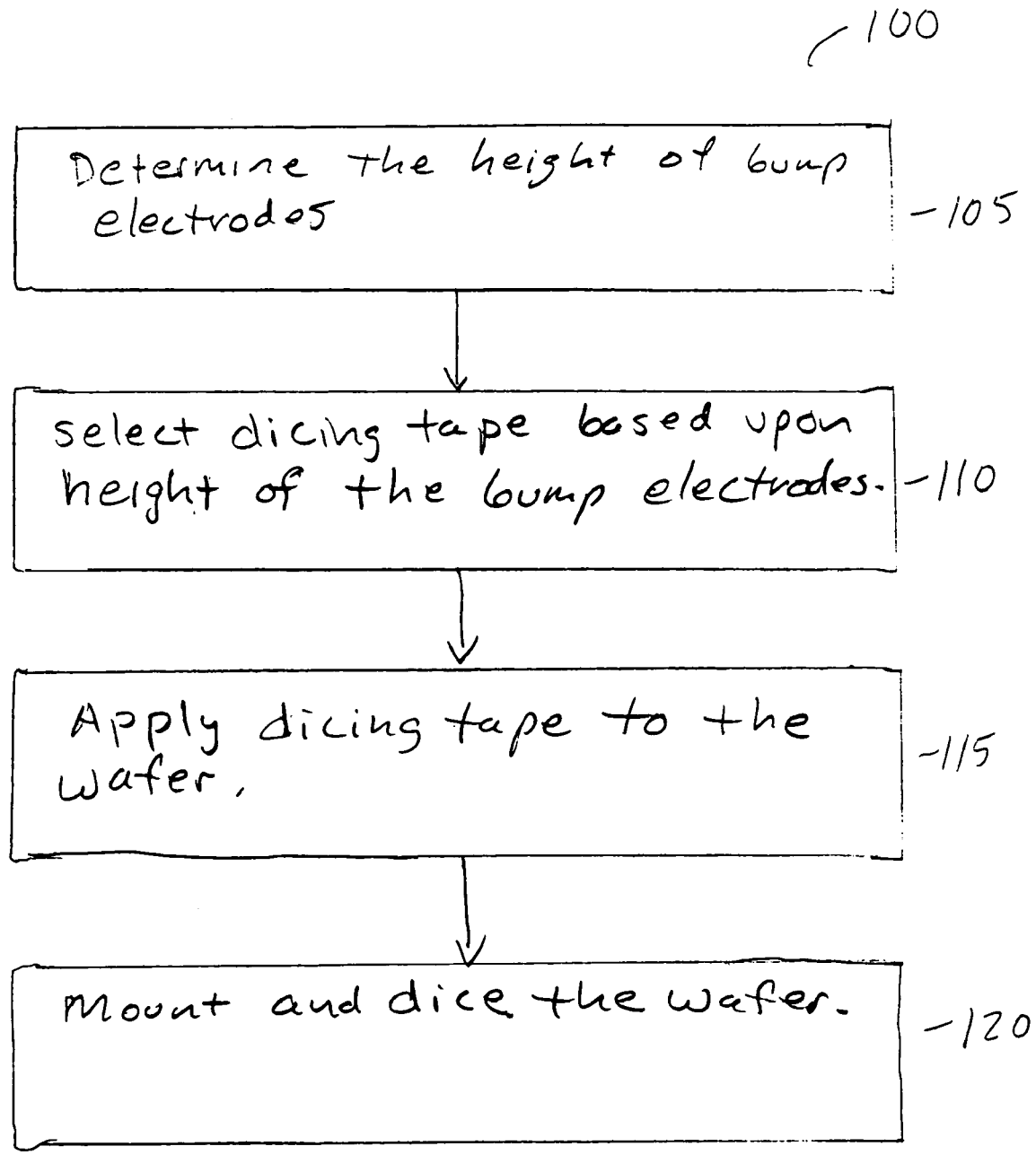
FIG. 1 illustrates a process by which a bumped wafer is mounted and diced in accordance with one embodiment of the invention.

FIG. 1 illustrates a process by which a double bumped wafer (i.e., a wafer having bumps on both sides) is mounted and diced in accordance with one embodiment of the invention. Process 100, shown in FIG. 1, begins at operation 105 in which the height of the bump electrodes is determined.

That is, the height of the bumps on one side of the wafer is determined. Typically, such bumps have a height of approximately 50–60 microns.

Figure 2:
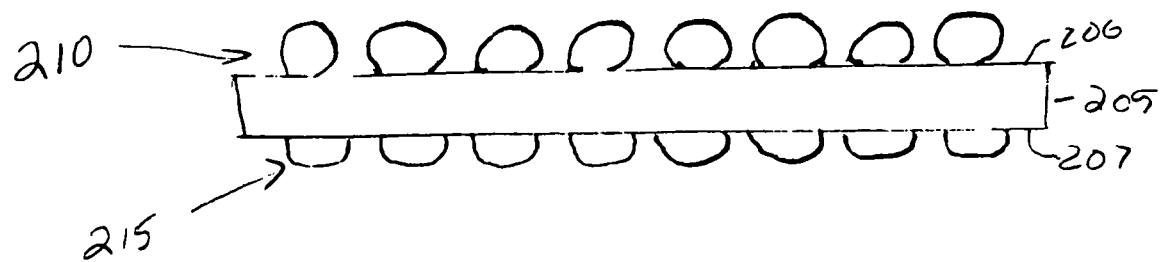
FIG. 2 illustrates a conventional double bumped wafer that can be diced in accordance with one embodiment of the invention.

FIG. 2 illustrates a conventional double bumped wafer that can be diced in accordance with one embodiment of the invention. As shown in FIG. 2, a double bumped wafer 205 has frontside bumps 210 on one side 206 of the wafer, and backside bumps 215 on the other side 207 of the wafer. For one embodiment, the frontside bumps 210 are substantially spherical and are made of a lead/tin alloy, while backside bumps 215 are flattened copper bumps.

Referring to FIG. 1, at operation 110 a dicing tape is selected based upon the height of the bump electrodes. For one embodiment of the invention, a dicing tape is selected that has an adhesive layer that is thicker than the height of the bumps determined at operation 105. For one embodiment, the dicing tape selected may have an adhesive layer approximately 130 microns thick, with a backing film approximately 100 microns thick, for a total thickness of 230 microns.

At operation 115, the dicing tape is applied to the wafer so that the adhesive engulfs the bumps and conforms to the bump shape.

Figure 3:
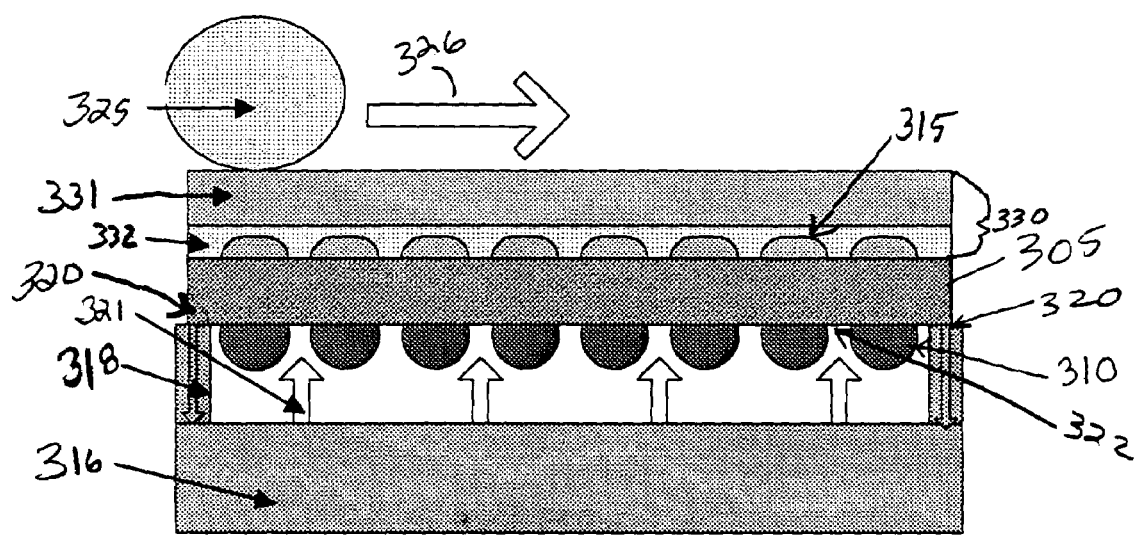
FIG. 3 illustrates an application of a dicing tape to a double bumped wafer in accordance with one embodiment of the invention.

FIG. 3 illustrates the application of a dicing tape to a double bumped wafer in accordance with one embodiment of the invention. As shown in FIG. 3, a double bumped wafer 305 is positioned upon a non-contact chuck 316 of a mounter (not shown). A vacuum 318 is applied to the edge surface 320 of the double bumped wafer 305 to hold the double bumped wafer 305 in position. A positive pressure 321 is applied to the remaining surface 322 of the double bumped wafer 305 to reduce bowing and cracking of the double bumped wafer 305 during application of the dicing tape 330. A mounting pressure roller 325 of the mounter is rolled across the backside (i.e., the non-adhesive side) of dicing tape 330 in direction 326. Dicing tape 330 has a backing film 331 and an adhesive layer 332. In accordance with one embodiment of the invention, adhesive layer 332 is thicker than backside bumps 315 of double bumped wafer 305.

In accordance with one embodiment, the dicing tape 330 is applied to the side of the double bumped wafer 305 having the smaller and more robust bumps. For example, backside bumps 315 may be copper bumps having a smaller vertical dimension than frontside bumps 310, which may be a lead-tin alloy. Moreover, backside bumps 315 may be flattened while frontside bumps 310 may be substantially spherical, rendering them more susceptible to damage during processing.

After application of the dicing tape to the double bumped wafer, the wafer may be suspended on the dicing tape, adhered to a support member with the frontside bumps facing up. The wafer may be placed in a support member, which may be a generally circular shaped metal frame configured to hold the wafer for dicing and transport.

Figure 4:
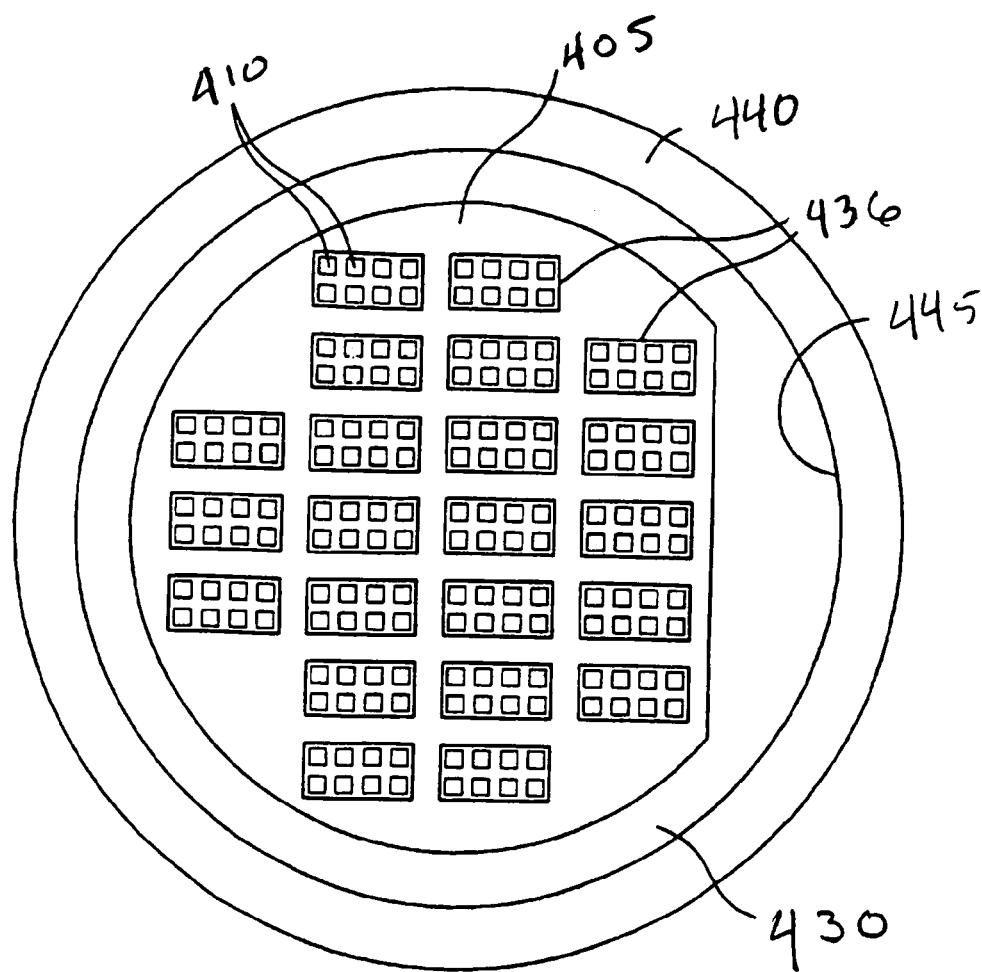
FIGS. 4 and 4A illustrate a wafer suspended within a support member in accordance with one embodiment of the invention.
Figure 4A:
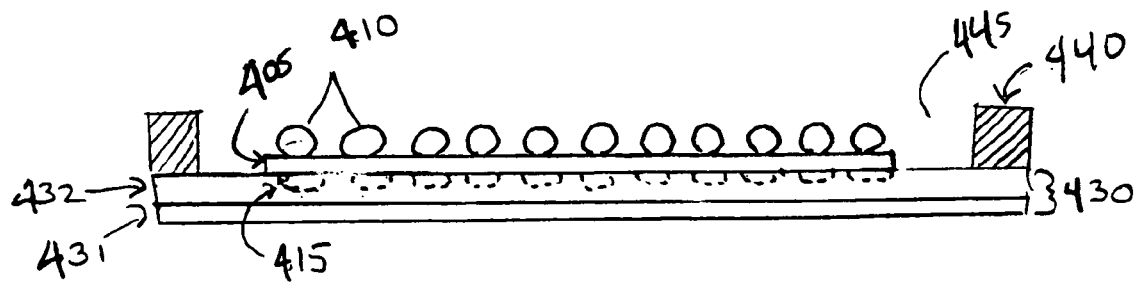

FIGS. 4 and 4A illustrate a wafer suspended within a support member in accordance with one embodiment of the invention. As shown in FIG. 4, a double bumped wafer 405, having a number of frontside bumps 410, on a plurality of components 436 is suspended in an annular ring 440. The annular ring has an open area 445. A dicing tape 430 is stretched over the open area 445. In accordance with one embodiment of the invention, dicing tape 430 has an adhesive layer that is thicker than the height of the backside bumps (not shown) of double bumped wafer 405.

FIG. 4A illustrates a side view of the wafer suspended within a support member of FIG. 4, in accordance with one embodiment of the invention. As shown in FIG. 4A, dicing tape 430 is applied to both the double bumped wafer 405 and the annular ring 440. Dicing tape 430 has a backing film 431 and an adhesive layer 432. Adhesive layer 432 is thicker than backside bumps 415 of double bumped wafer 405.

Referring again to FIG. 1, at operation 120 the wafer is diced through one of various conventional means. For one embodiment of the invention, a dual blade, stepcut dicing process is employed to dice the double bumped wafer.

Figure 5:
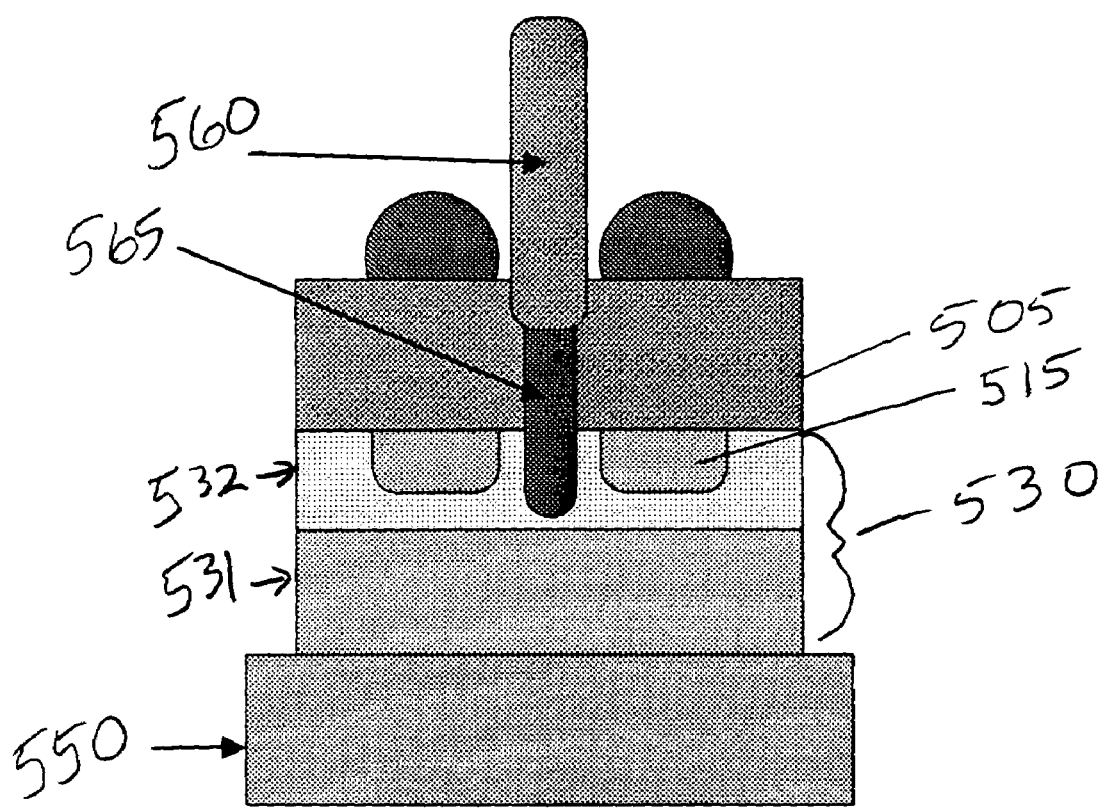
FIG. 5 illustrates dicing of a double bumped wafer using a stepcut dicing in accordance with one embodiment of the invention.

FIG. 5 illustrates dicing of a double bumped wafer using a stepcut dicing in accordance with one embodiment of the invention. As shown in FIG. 5, a double bumped wafer 505 is positioned upon a dicing chuck 550. Double bumped wafer 505 has applied thereto a dicing tape 530. Dicing tape 530 has a backing film 531 and an adhesive layer 532. In accordance with one embodiment of the invention, adhesive layer 532 is thicker than backside bumps 515 of double bumped wafer 505. A first blade 560 of a dual blade dicer (not shown) cuts into the wafer between the components (not shown), approximately a quarter of the wafer thickness. A second blade 565 then cuts through the remainder of the wafer and into the adhesive layer 532 of the dicing tape 530. In accordance with one embodiment, the dicing process is controlled such that the second blade 565 does not cut too deeply into the adhesive layer 532 of dicing tape 530, which helps to keep the adhesive loading of the second blade 565 within tolerable limits.

General Matters

Embodiments of the invention provide a method for mounting and dicing a double bumped wafer. For one embodiment, the thickness of the adhesive layer of a dicing tape is greater than the height of the bumps to which it is applied. An adhesive layer of this thickness conforms to the bumps and reduces deformation caused by pressure from the mounting roller. For one embodiment of the invention, a dicing tape having an adhesive strength of approximately 200 grams/25 mm$^2$ is used. The thickness and adhesive strength of the dicing tape are sufficient to keep the double bumped wafer rigid, while not allowing dicing residue (slurry) to adhere to the backside bumps or backside surface of the wafer.

For one embodiment of the invention, a radiation sensitive dicing tape is employed, such that exposure of the backside of the tape reduces the adhesive strength. For one such embodiment, the adhesive strength is reduced from approximately 200 grams/25 mm$^2$ to approximately 2 grams/25 mm$^2$. This allows for easy removal of the die from the dicing tape.

Embodiments of the invention have been described in which the adhesive layer of a dicing tape is thick enough to cover and conform to the bumps. This adhesive layer helps to distribute pressure from the mounting pressure roller, thereby helping to ensure that the bumps are not deformed or at least reducing the extent of deformation.

For various alternative embodiments, the adhesive may be applied independently of the dicing tape or the dicing tape may be formed by the independent application of an adhesive layer and a backing layer. For example, for one embodiment of the invention, a layer of adhesive is applied to the surface of the wafer such that the layer of adhesive, partially or completely, covers the bumps. Subsequently, a backing film is applied to the adhesive layer.

For another alternative embodiment of the invention, a thin layer of adhesive is applied to the wafer, followed by a filler layer made of a malleable substance. Subsequently, a second layer of adhesive material is applied to the filler layer. The thickness of the thin adhesive layer, the filler layer, and the second adhesive layer, combined, is sufficient to cover the bumps. Finally, a backing film is applied to the second adhesive layer.

Embodiments of the invention include various operations. Many of the methods are described in their most basic form, but operations can be added to or deleted from any of the methods without departing from the basic scope of the invention.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   selecting a dicing tape with an adhesive layer that has a thickness greater than a height of one or more bump electrodes formed on a first side of a wafer, wherein the wafer is a double bumped wafer with bump electrodes formed on a second side;
   applying the dicing tape to the first side of the wafer using a mounting pressure roller such that the adhesive layer contacts and conforms to the one or more bump electrodes;
   dicing the wafer from the second side of the wafer opposite the first side, the dicing extending into the adhesive layer a distance less than a thickness of the adhesive layer; and
   after dicing, reducing an adhesive strength of the adhesive layer by exposing the adhesive layer to radiation.

2. The method of claim 1 wherein the bump electrodes have a height of approximately 60 microns and the adhesive layer has a thickness of approximately 130 microns.

3. The method of claim 2, wherein dicing comprises:
   dicing the wafer using a dual-blade dicing process wherein a first blade dices through less than an entire thickness of the wafer followed by a second blade that dices through the wafer.

4. The method of claim 1 wherein the adhesive strength is reduced from a pre-radiation adhesive strength of approximately 200 grams/25 $mm^2$ to a post-radiation adhesive strength of approximately 2 grams/25 $mm^2$.

5. A method comprising:
   determining a height of one or more bump electrodes on a first side of a wafer surface;
   selecting a dicing tape based upon the determined height of the one or more bump electrodes, a first side of the dicing tape comprising an adhesive layer thicker than the determined height of the one or more bump electrodes;
   applying the first side of the dicing tape to the first side of the wafer such that the adhesive layer contacts and conforms to the one or more bump electrodes; and
   dicing the wafer from a second side of the wafer opposite the first side, the dicing extending into the adhesive layer a distance less than a thickness of the adhesive layer,
   wherein the dicing tape is a radiation sensitive tape having a pre-radiation adhesive strength of approximately 200 grams/25 $mm^2$, and a post-radiation adhesive strength of approximately 2 grams/25 $mm^2$.

6. The method of claim 5 wherein the dicing tape is applied using a mounting pressure roller wherein the adhesive layer helps to distribute a pressure applied by the mounting pressure roller.

7. The method of claim 5 wherein the bump electrodes have a height of approximately 60 microns and the adhesive layer has a thickness of approximately 130 microns.

8. The method of claim 7 further comprising:
   dicing the wafer using a dual-blade dicing process.

9. The method of claim 8 further comprising:
   wherein reducing an adhesive strength comprises irradiating a second side of the dicing tape.

* * * * *